US010602648B2

(12) United States Patent  
Takada

(10) Patent No.: US 10,602,648 B2  
(45) Date of Patent: Mar. 24, 2020

(54) TAPE FEEDER

(71) Applicant: FUJI CORPORATION, Chiryu-shi (JP)

(72) Inventor: Yukinori Takada, Anjo (JP)

(73) Assignee: FUJI CORPORATION, Chiryu-shi (JP)

(*) Notice: Subject to any disclaimer, the term of this patent is extended or adjusted under 35 U.S.C. 154(b) by 385 days.

(21) Appl. No.: 15/532,863

(22) PCT Filed: Dec. 3, 2014

(86) PCT No.: PCT/JP2014/082003  
§ 371 (c)(1),  
(2) Date: Jun. 2, 2017

(87) PCT Pub. No.: WO2016/088224  
PCT Pub. Date: Jun. 9, 2016

(65) Prior Publication Data  
US 2018/0270998 A1  Sep. 20, 2018

(51) Int. Cl.  
*H05K 13/02* (2006.01)  
*H05K 13/04* (2006.01)

(52) U.S. Cl.  
CPC ......... *H05K 13/02* (2013.01); *H05K 13/0419* (2018.08)

(58) Field of Classification Search  
CPC . H05K 13/02; H05K 13/0417; H05K 13/0419  
See application file for complete search history.

(56) References Cited

U.S. PATENT DOCUMENTS 4,440,355 A * 4/1984 Mori ................. H05K 13/0419  
156/750  
4,620,655 A * 11/1986 Fujita ................. H05K 13/0417  
221/186

(Continued)

FOREIGN PATENT DOCUMENTS

JP  6-1523 A  1/1994  
JP  7-101409 A  4/1995

(Continued)

OTHER PUBLICATIONS

Extended European Search Report dated Nov. 27, 2017 in Patent Application No. 14907450.2

(Continued)

*Primary Examiner* — Saul Rodriguez  
*Assistant Examiner* — Ashley K Romano  
(74) *Attorney, Agent, or Firm* — Oblon, McClelland, Maier & Neustadt, L.L.P.

(57) ABSTRACT

A one-directional clutch that only allows rotation in the forward direction, that is the cover tape pulling direction, is provided between, of two cover tape pulling gears, the lower side cover tape pulling gear and shaft thereof, such that reverse rotation of cover tape pulling gears is prevented by the one-directional clutch. For the engaging portion of the one-directional clutch and cover tape pulling gear, the friction of the engaging portion of the one-directional clutch and the cover tape pulling gear is adjusted such that the cover tape pulling gear slip rotates in the reverse direction when a specified rotational force or greater in the reverse direction that is greater than the force required to peel the cover tape is applied to the cover tape pulling gear.

4 Claims, 12 Drawing Sheets

(56) References Cited

U.S. PATENT DOCUMENTS

| | | | | |
|---|---|---|---|---|
| 4,657,158 A * | 4/1987 | Faes | H05K 13/0417 | 221/197 |
| 4,850,780 A * | 7/1989 | Safabakhsh | H01L 21/67132 | 414/416.1 |
| 4,923,089 A * | 5/1990 | Hineno | H05K 13/0419 | 221/1 |
| 4,990,051 A * | 2/1991 | Safabakhsh | H01L 21/67132 | 156/707 |
| 5,492,593 A * | 2/1996 | Ariga | H05K 13/0419 | 156/765 |
| 5,531,859 A * | 7/1996 | Lee | B65H 41/00 | 156/765 |
| 5,588,614 A * | 12/1996 | Takada | B65H 37/002 | 242/538.2 |
| 5,695,309 A * | 12/1997 | Kondo | H05K 13/0417 | 156/750 |
| 5,865,359 A * | 2/1999 | Kanai | H05K 13/0419 | 226/122 |
| 6,032,845 A * | 3/2000 | Piccone | B65H 20/22 | 226/139 |
| 6,082,603 A * | 7/2000 | Takada | H05K 13/0417 | 226/157 |
| 6,199,738 B1* | 3/2001 | Kondo | H05K 13/0419 | 226/110 |
| 6,202,728 B1* | 3/2001 | Takada | H05K 13/0419 | 156/750 |
| 6,202,913 B1* | 3/2001 | Takada | H05K 13/0417 | 226/120 |
| 6,269,860 B1* | 8/2001 | Ishikawa | H05K 13/0417 | 156/750 |
| 6,368,045 B1* | 4/2002 | Ashman | B65H 20/22 | 414/403 |
| 6,474,527 B2* | 11/2002 | Miller | B65H 20/22 | 226/128 |
| 8,276,267 B2* | 10/2012 | Choi | H05K 13/0419 | 29/832 |
| 2002/0042989 A1* | 4/2002 | Kawase | H05K 13/0478 | 29/832 |
| 2002/0062927 A1* | 5/2002 | Hwang | H05K 13/0417 | 156/362 |
| 2002/0063137 A1* | 5/2002 | Hwang | H05K 13/0417 | 221/25 |
| 2003/0116934 A1* | 6/2003 | Endo | H05K 13/0417 | 280/47.35 |
| 2004/0094450 A1* | 5/2004 | Whiteman | H01C 17/281 | 206/701 |
| 2004/0200578 A1* | 10/2004 | Ju | H05K 13/0417 | 156/765 |
| 2006/0102681 A1* | 5/2006 | Ricketson | B65H 20/22 | 226/128 |
| 2010/0242267 A1* | 9/2010 | Tsukagoshi | H05K 13/0417 | 29/739 |

FOREIGN PATENT DOCUMENTS

| | | |
|---|---|---|
| JP | 2000-124667 A | 4/2000 |
| JP | 2007-158145 A | 6/2007 |
| JP | 2013-98383 A | 5/2013 |

OTHER PUBLICATIONS

International Search Report dated Feb. 10, 2015 in PCT/JP2014/082003 Filed Dec. 3, 2014.

* cited by examiner

TAPE FEEDER

TECHNICAL FIELD

The present application relates to a tape feeder provided with a cover tape pulling device that peels cover tape (also referred to as top tape) from the top surface of component supply tape and pulls the cover tape in a direction opposite to the tape feeding direction.

BACKGROUND ART

The tape feeder disclosed in patent literature 1 (JP-A-2013-98383) is provided with a tape feeding device that feeds component supply tape pulled from a tape reel to a component pickup position, and a cover tape pulling device that peels cover tape from the top surface of the component supply tape forward of the component pickup position and pulls the cover tape in a direction opposite to the tape feeding direction in accordance with the feeding operation of the component supply tape, with components inside the component supply tape being picked up by a suction nozzle at the component pickup position and mounted on a circuit board. The cover tape pulling device is configured to pull the cover tape by sandwiching the cover tape peeled from the top surface of the component supply tape between two gears that engage with each other, the cover tape being pulled by the gears being rotated by a gear driving device, such that the cover tape is collected inside a cover tape collecting case.

Also, the tape feeder of patent literature 2 (JP-A-H6-1523) winds the cover tape peeled from the top surface of the component supply tape onto a winding reel.

With tape feeders, it is necessary for the feeding amount of the component supply tape and the peeling amount of the cover tape to be the same, but during a stoppage in tape feeding operation, if the cover tape is reversed by the gear or the winding reel being reverse rotated due to the tension of the cover tape or the like, the cover tape peeling amount during subsequent tape feeding operation is insufficient by the reversed amount, thus causing component pickup errors to occur.

Generally, tape feeders prevent the reversing of peeled cover tape using the self holding power of a motor, but if a motor with sufficient self holding power cannot be used due to reduction ratio or size considerations or the like, or if self holding power is lost due to electric power of the motor being turned off or the like, it is not possible to prevent the reversing of peeled cover tape.

Thus, with patent literature 2 above, a one-directional clutch that only allows rotation in a forward direction that is the winding direction of the cover tape is provided between the winding reel and the shaft thereof, and provided on the one-directional clutch is a release device that switches between a state of operation of a reverse rotation prevention function and a state of operation of releasing reverse rotation prevention function such that free reverse rotation is possible, such that it is possible to reverse rotate (take up) the winding reel in the event that an operator feeds the tape too much and winds too much cover tape when setting the component supply tape on the tape feeder, and in a case in which the operator reverse rotates the winding reel to take up the cover tape, the operator operates the release device to release the reverse rotation prevention of the one-directional clutch.

CITATION LIST

Patent Literature

Patent Literature 1: JP-A-2013-98383
Patent Literature 2: JP-A-H6-1523

SUMMARY

However, with the configuration of the above patent literature 2, because the configuration provides a release device that switches between operation and non-operation of the reverse rotation prevention function of the one-directional clutch, the configuration suffers from being complex and costly. Further, because it is necessary for the operator to operate the release device to switch between the operation and non-operation of the reverse rotation prevention function of the one-directional clutch, not only is performing that operation troublesome, but it is possible that an operator may forget to perform operation, resulting in the reverse rotation prevention function of the one-directional clutch not operating, thereby causing a problem in which the cover tape cannot be wound; as a result, it is possible that the cover tape may not be peeled from the top surface of the component supply tape during feeding of the component supply tape, leading to a problem of component pickup errors occurring.

To solve the above problems, the present disclosure is a tape feeder including: a tape feeding device configured to feed component supply tape to a component pickup position; and a cover tape pulling device configured to peel cover tape from a top surface of the component supply tape forward of the component pickup position and pull the cover tape in a direction opposite to the tape feeding direction in accordance with the feeding operation of the component supply tape; wherein the cover tape pulling device is configured to pull the cover tape by sandwiching the cover tape peeled from the top surface of the component supply tape between two gears that engage with each other, the cover tape being pulled by the gears being rotated by a gear driving device, a one-directional clutch that allows only rotation in a forward direction that is a winding direction of the cover tape is provided between, from among the two gears, at least one of the gears and a shaft thereof, and an engaging portion of the one-directional clutch and the gear is configured such that the gear slip rotates in a reverse direction when a specified rotational force or greater in the reverse direction that is greater than a force required to peel the cover tape is applied with respect to the gear.

With this configuration, because the configuration is such that the gear slip rotates in the reverse direction when a specified rotational force or greater in the reverse direction that is greater than a force required to peel the cover tape is applied with respect to the gears that sandwich the cover tape, the configuration that allows rotation of the gear in the reverse direction (take-up of the cover tape) is simple, and a demand for lower costs is satisfied. Further, because there is no need to provide a release mechanism that switches between operation and non-operation of the reverse rotation prevention function of the one-directional clutch, an operator does not have to perform operation of switching between operation and non-operation of the reverse rotation prevention function of the one-directional clutch, and, as well as it being possible to take up the cover tape by reverse rotating the gears with a simple operation of just pulling the cover tape in the take-up direction, it is possible to reliably operate the reverse rotation prevention function of the one-directional clutch during feeding operation of the component supply tape, cover tape is reliably peeled from the top surface of the component supply tape, and occurrences of component pickup errors are prevented.

However, as in the present disclosure, with a configuration in which the gear slip rotates in the reverse direction when a specified rotational force or greater in the reverse direction is applied to the gear engaged with the one-directional clutch, if the manufacturing variations of the internal diameter of the gear and the external diameter of the one-directional clutch are large, making the variation of the frictional force between the engaging portion of the one-directional clutch and the gear large, this leads to the variation in the rotational force in the reverse direction required to reverse rotate the gear being undesirably large.

To counter this, an expansion groove may be formed in the gear with the one-directional clutch, such that the internal diameter of the gear is elastically deformable. By forming an expansion groove on the gear, it is possible to elastically deform the internal diameter of the gear in accordance with the variation in the external diameter of the one-directional clutch, making it possible to absorb the manufacturing variation in the internal diameter of the gear and the external diameter of the one-directional clutch via the change in the dimension of the gap in the expansion groove, thus decreasing the variation in the reverse rotational force required to reverse rotate the gear, thereby allowing less strict management of the dimensional accuracies during manufacturing.

Note that, depending on the position at which the expansion groove is formed on the gear, teeth of the opposite gear might more easily interfere with the expansion groove, possible inhibiting the smooth rotation of the gears.

Thus, a tooth of the gear with the one-directional clutch may be missing, and the expansion groove formed in a center section of the portion at which the tooth is missing. Accordingly, the gap between the expansion groove and the tooth of the opposite gear is widened, preventing interference between the expansion groove and the tooth of the opposite gear, thereby preventing the inhibiting of the smooth rotation of the gears that might otherwise occur due to the expansion groove.

In this case, for the two teeth adjacent to the expansion groove among the teeth of the gear with the one-directional clutch, the tooth pitch changes based on the change in the dimension of the gap of the expansion groove, which may lead to the occurrence of gear engaging problems.

For this, the two teeth adjacent to the expansion groove may be formed with a lower tooth depth and a smaller tooth thickness compared to the other teeth. Accordingly, it is possible to prevent the occurrence of gear engaging problems between the two teeth adjacent to the expansion groove and the opposite gear.

The present disclosure can be applied to tape feeders of various configurations, for example, a tape feeder configured such that a tape supplier that guides component supply tape pulled from a tape reel to a component pickup position is removably set on a feeder main body. In this case, the two gears that sandwich the cover tape are provided on the tape supplier, and the gear driving device is provided on the feeder main body. With a tape feeder with such a configuration, when the tape supplier is removed from the feeder main body, the connection between the gear on the tape supplier side and the gear driving device on the feeder main body side is broken, such that the self holding power of the gear driving device on the feeder main body side no longer applies to the gear on the tape supplier side; however, because the reverse rotation of the gear on the tape supplier side is prevented by the one-directional clutch, take-up of the cover tape is prevented.

DESCRIPTION OF EMBODIMENTS

Figure 1:
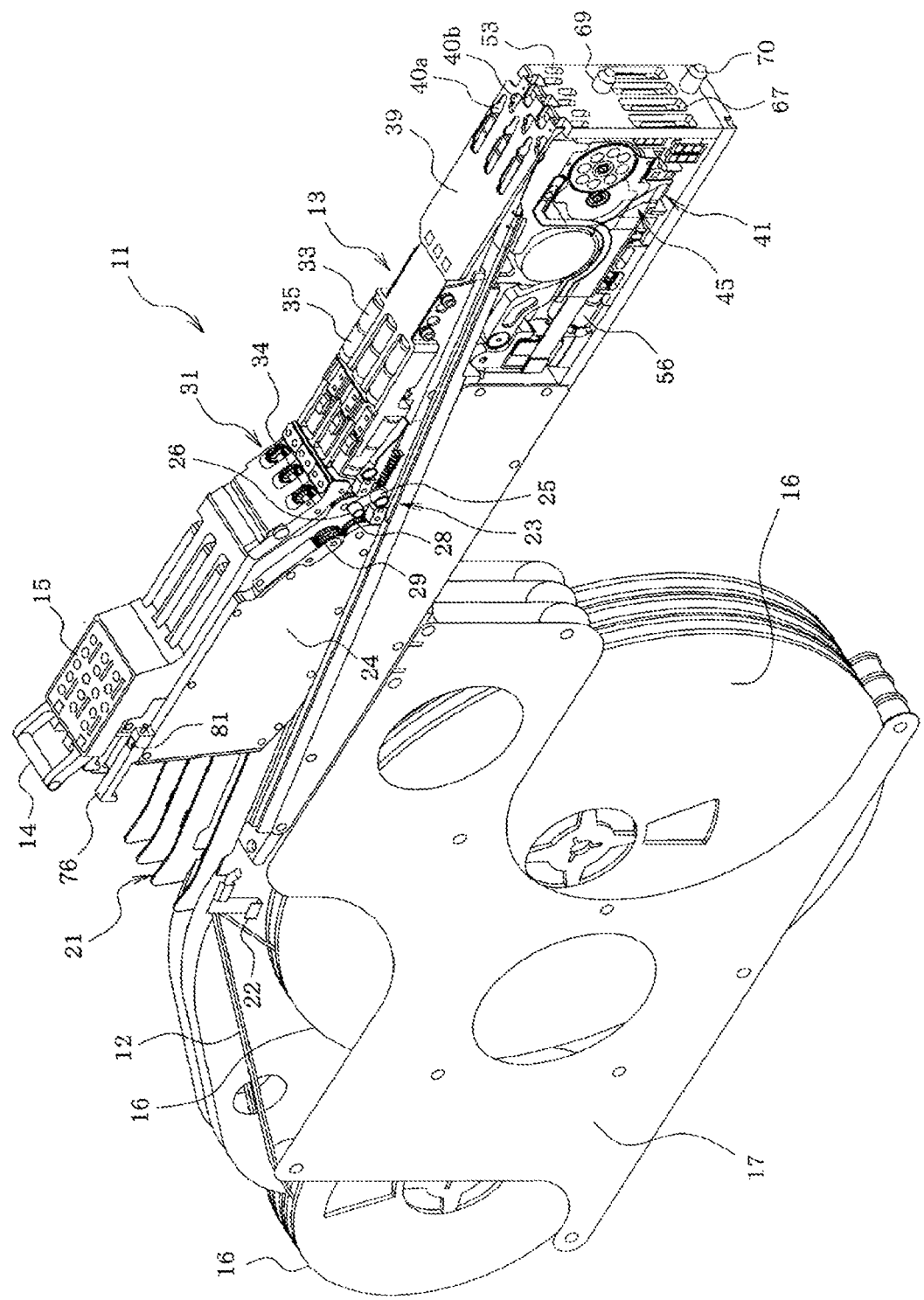
FIG. 1 is a perspective view of an entire tape feeder as an embodiment of the present disclosure.
Figure 2:
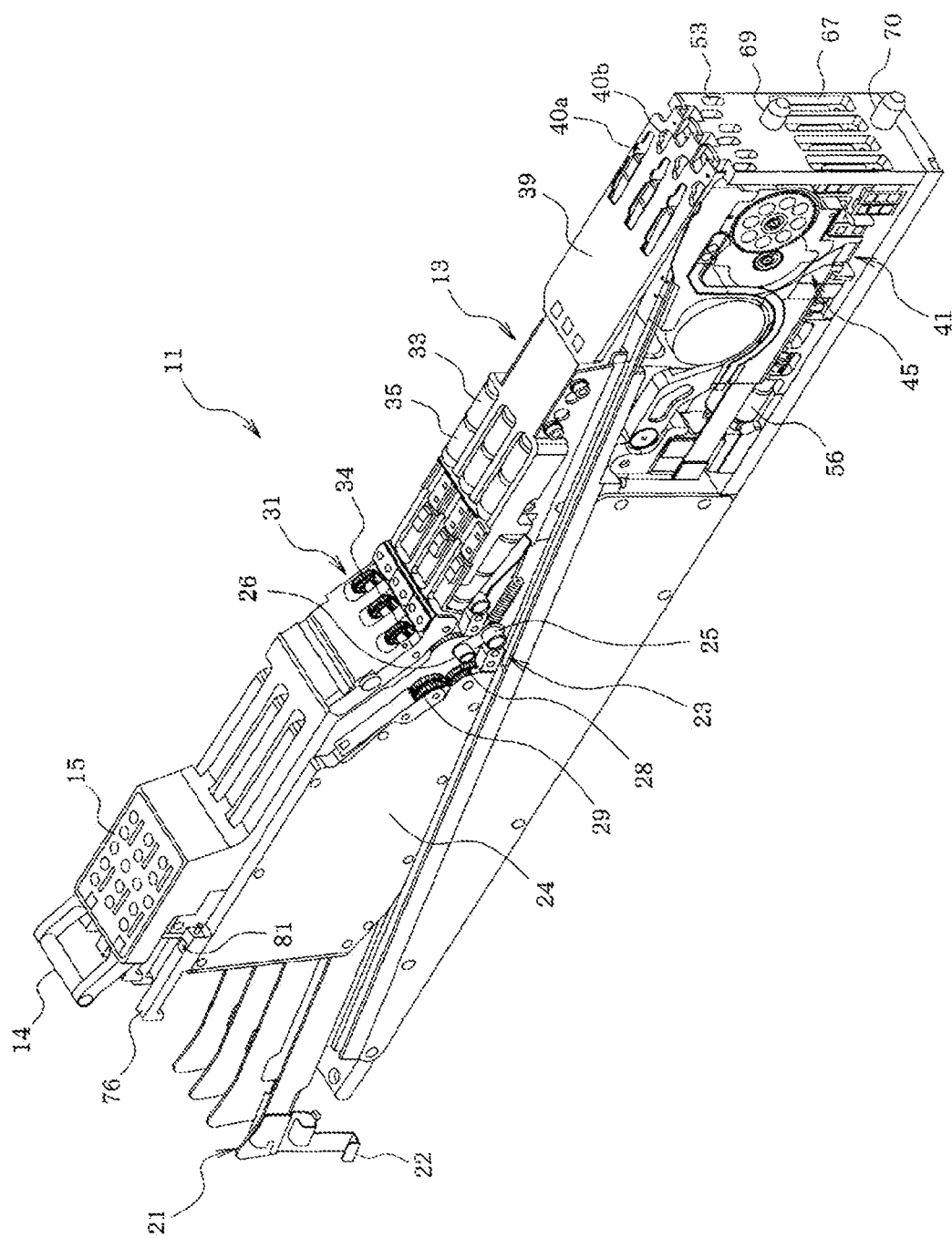
FIG. 2 is a (first) perspective view of a feeder main body.

An embodiment of the present disclosure is described below with reference to the drawings. First, the configuration of tape feeder 11 is described.

Tape feeder 11 is constructed so that feeder main body 13 has a width that is an approximate multiple of the width of a standard tape feeder (a tape feeder on which only one component supply tape can be set), so that multiple component supply tapes 12 can be set widthwise next to each other. In the present embodiment, by making the gap between adjacent component supply tapes 12 small, the width of feeder main body 13 is about four times (about M times), for example, the width of a standard tape feeder, which means the configuration is such that six (N, where N is an integer larger than M) component supply tapes 12 can be set widthwise next to each other. Component supply tape 12, although not shown in detail, has cover tape (also referred to as top tape) adhered to the top surface of carrier tape in which components are stored in component storage recesses formed in a line at a specified pitch in the carrier tape, and tape indexing holes (not shown) are formed in a line at a specified pitch along an edge of component supply tape 12.

Handle 14 and operation panel 15 are provided on an upper section on the rear side (removal direction side) of feeder main body 13, and reel holder 17 that stores tape reel 16 on which component supply tape 12 is wound is provided on the underside. Reel holder 17 is formed such that multiple tape reels 16 can be arranged in two rows front and back, and each tape reel 16 is stored so that it can be rotated within reel holder 17 in accordance with the pulling out of component supply tape 12. Operation panel 15 is provided with items such as operation keys for inputting various types of operation signal such as a tape supplier attachment work start signal to each sprocket driving unit 41 (each tape supplier 21), which is described below.

Component supply tape 12 pulled out from each tape reel 16 is guided to a component pickup position by tape supplier 21. The lateral width of each tape supplier 21 is formed to be slightly greater than that of component supply tape 12 so that only one component supply tape 12 is set in each tape supplier 21.

Feeder main body 13 is provided with multiple slots for attaching multiple tape suppliers 21, with each slot formed such that one tape supplier 21 can be removably attached.

Figure 4:
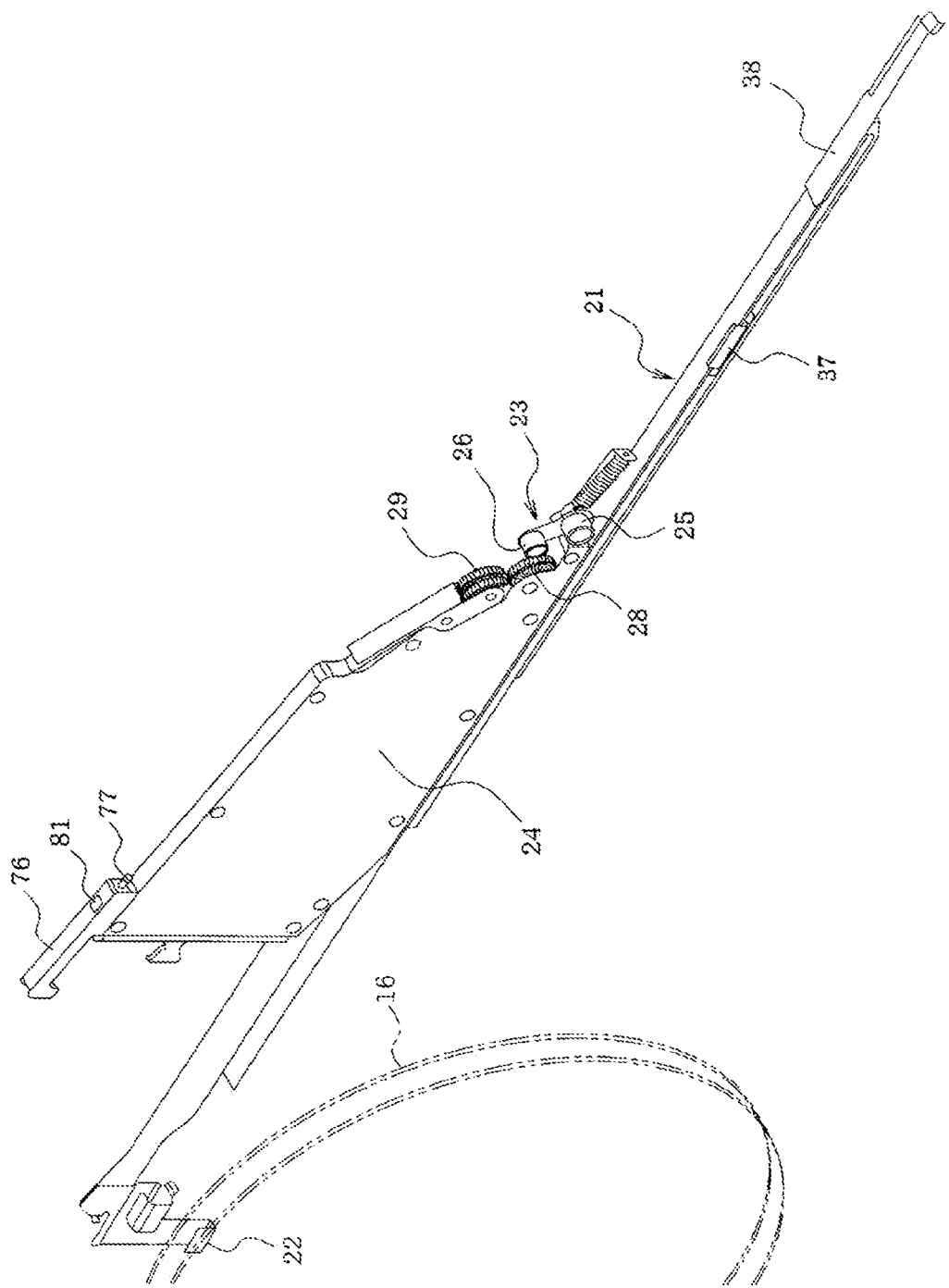
FIG. 4 is a perspective view of a tape supplier.

As shown in FIG. 4, the rear end of each tape supplier 21 is equipped with reel hook 22 for holding tape reel 16 when tape supplier 21 is removed from feeder main body 13, and tape reel 16 can be held on reel hook 22.

Tape supplier 21 is provided with cover tape peeling device 23 for peeling the cover tape that covers the top surface of component supply tape 12, and cover tape collection case 24 for collecting cover tape peeled from component supply tape 12. Cover tape peeling device 23 is provided with peeling roller 25, tension roller 26, and pair of cover tape pulling gears 28 and 29; cover tape peeled from the top surface of component supply tape forward from the component pickup position is supported by peeling roller 25 and tension roller 26, sandwiched between cover tape pulling gears 28 and 29, and sent to cover tape collection case 24.

Figure 5:
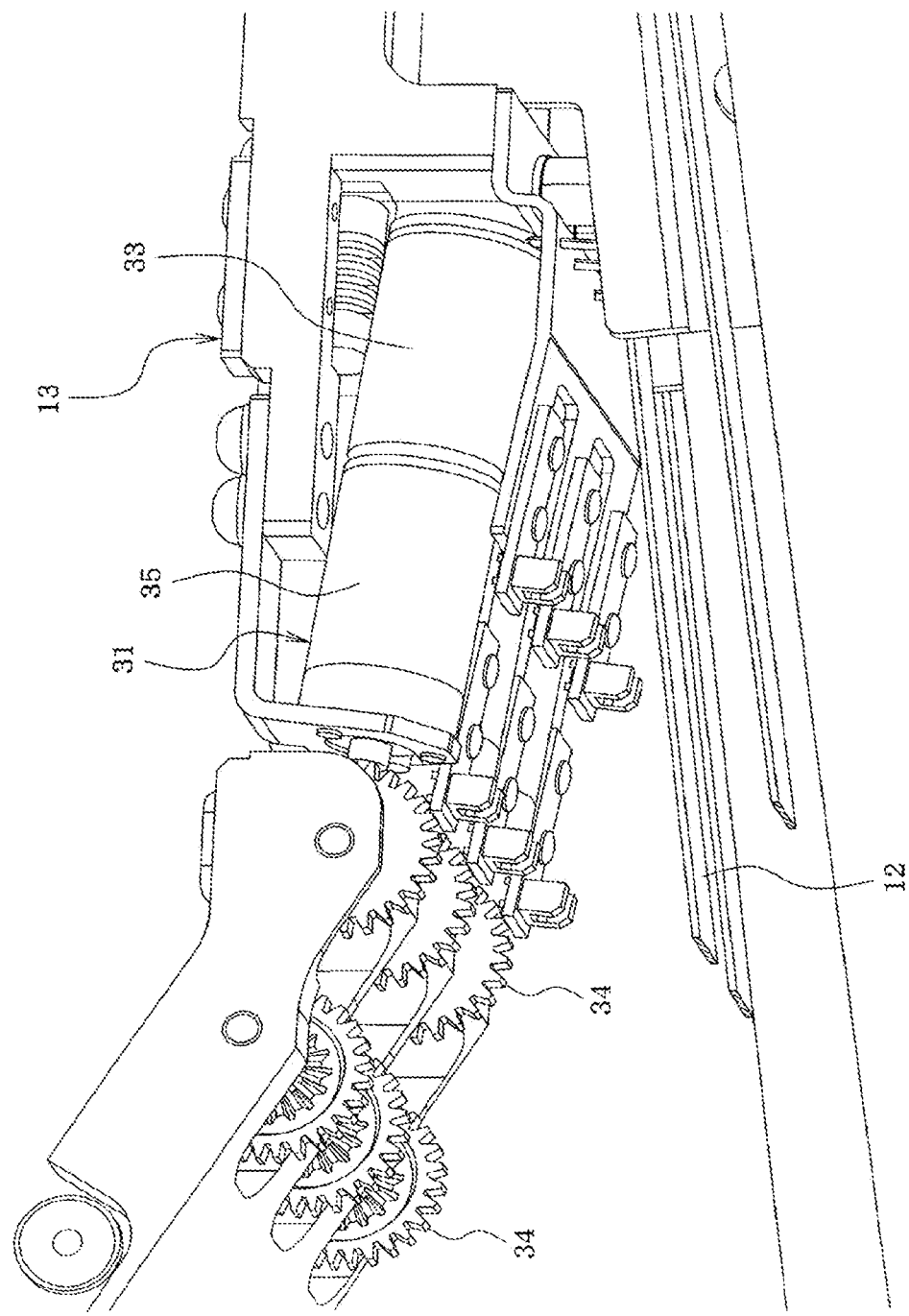
FIG. 5 is a (first) perspective view showing a gear driving device and a surrounding portion.
Figure 10:
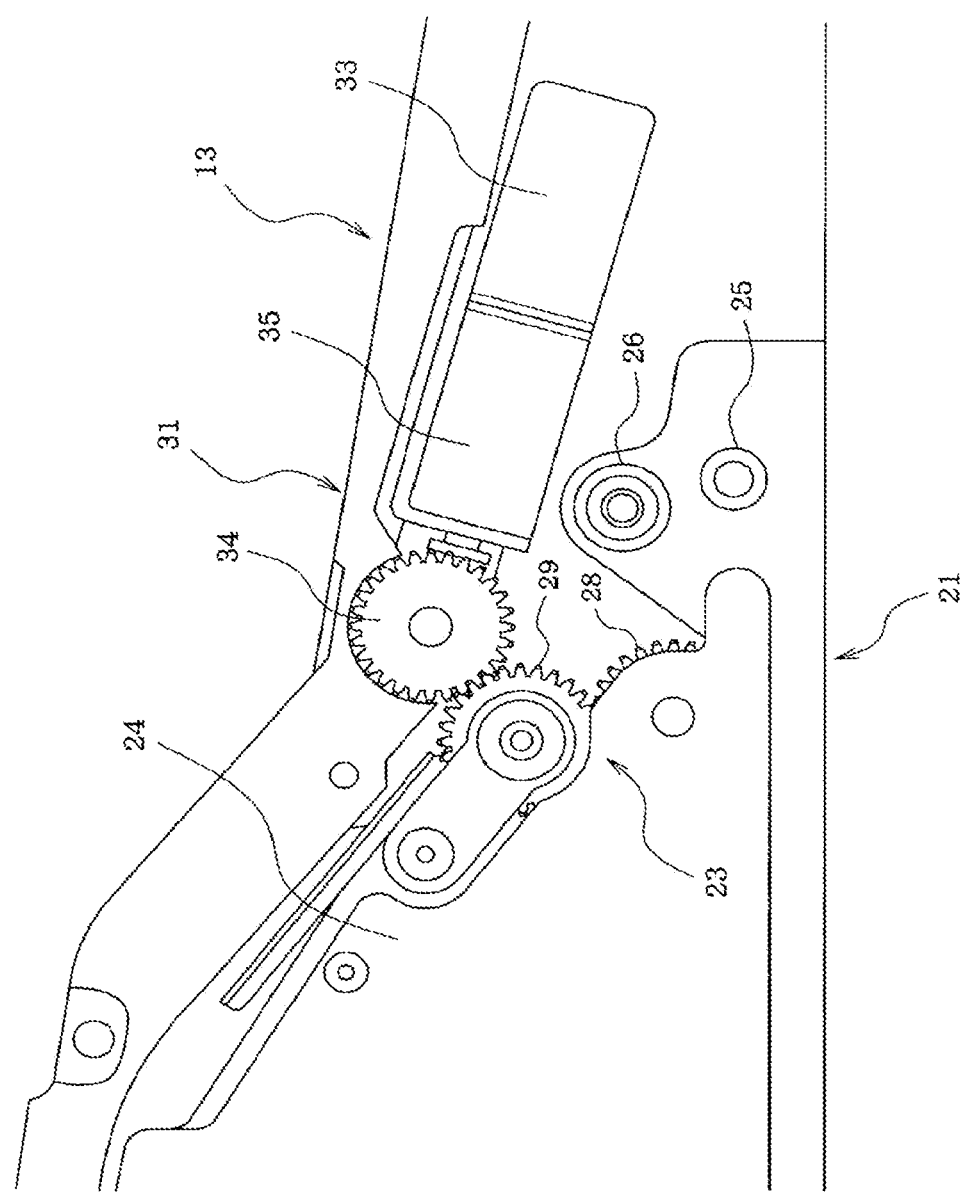
FIG. 10 is a side view of the cover tape pulling device.

Gear driving device 31 that drives cover tape pulling gears 28 and 29 is provided above the attachment space of tape supplier 21 on feeder main body 13, and when tape supplier 21 is attached to feeder main body 13, one of the cover tape pulling gears, 28, engages with drive gear 34 (refer to FIGS. 5 and 10) of gear driving device 31 on the feeder main body 13 side such that both the cover tape pulling gears 28 and 29 rotate.

Figure 6:
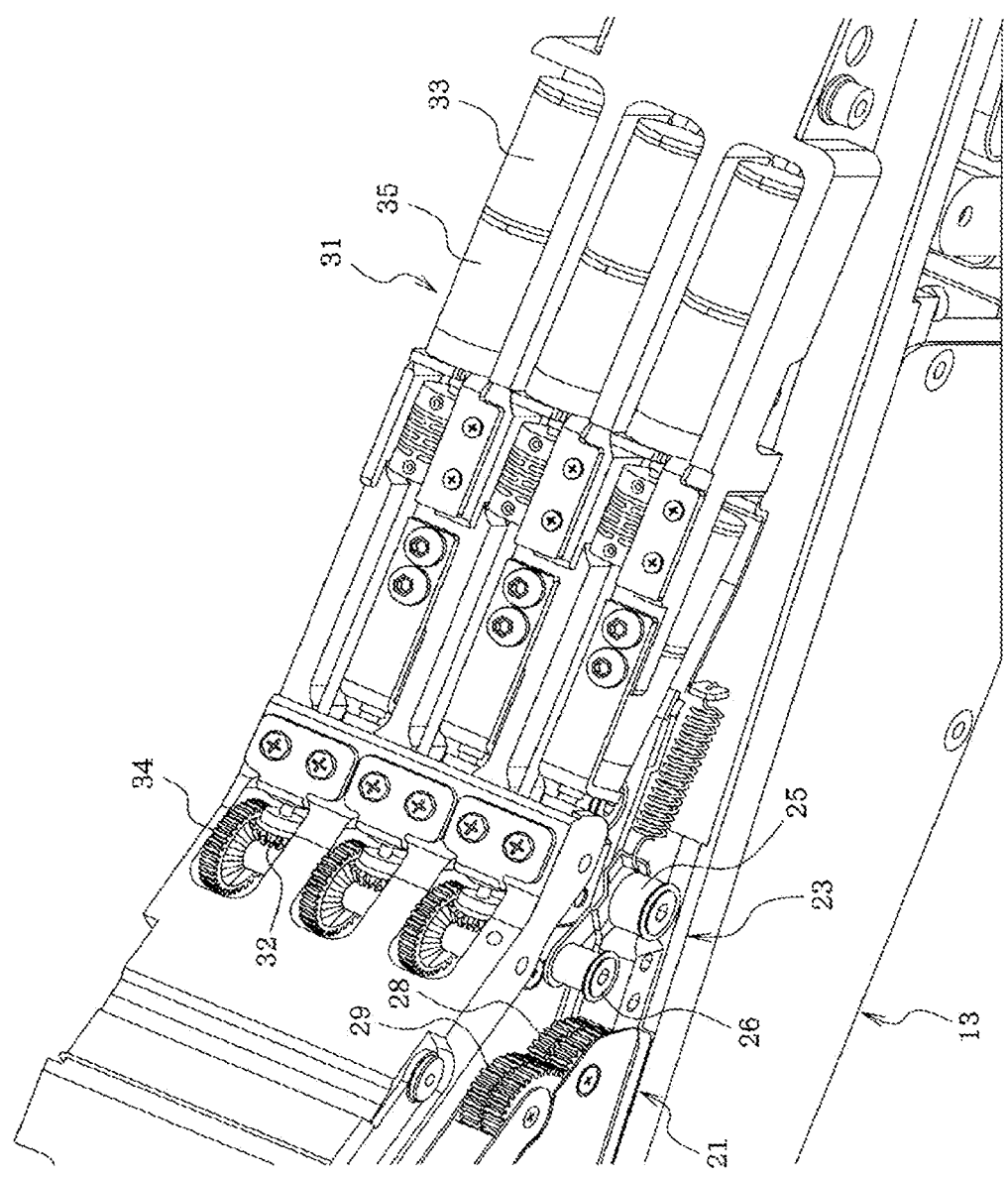
FIG. 6 is a (second) perspective view showing a gear driving device and a surrounding portion.

Gear driving device 31 is provided with motor 33 that is a drive source that rotates bevel gear 32 (refer to FIG. 6), reduction mechanism 35 that reduces the rotation of motor 33 by a specified reduction ratio and transmits the rotation to bevel gear 32, and drive gear 34 that rotates due to bevel gear 32; by drive gear 34 engaging with the upper side cover tape pulling gear 29, both cover tape pulling gears 28 and 29 are rotated. The same number of each of motor 33, bevel gear 32, and drive gear 34 are provided as the number of tape suppliers 21 that can be attached to feeder main body 13; with the amount that the cover tape is peeled (the indexing amount) being able to be controlled independently for each tape supplier 21.

As shown in FIG. 4, on tape supplier 21, multiple C-shaped tape retainers 37 and 38 that support component supply tape 12 from one side only are arranged so that one supports component supply tape 12 from one side while the other supports it from the other side in an alternating zig-zag pattern; this slightly contorts component supply tape 12 widthwise (or tilts it diagonally) while supporting it, with each tape retainer 37 and 38 arranged slightly offset within the width of component supply tape 12, meaning that component supply tape 12 can be supported within a narrower width.

Figure 3:
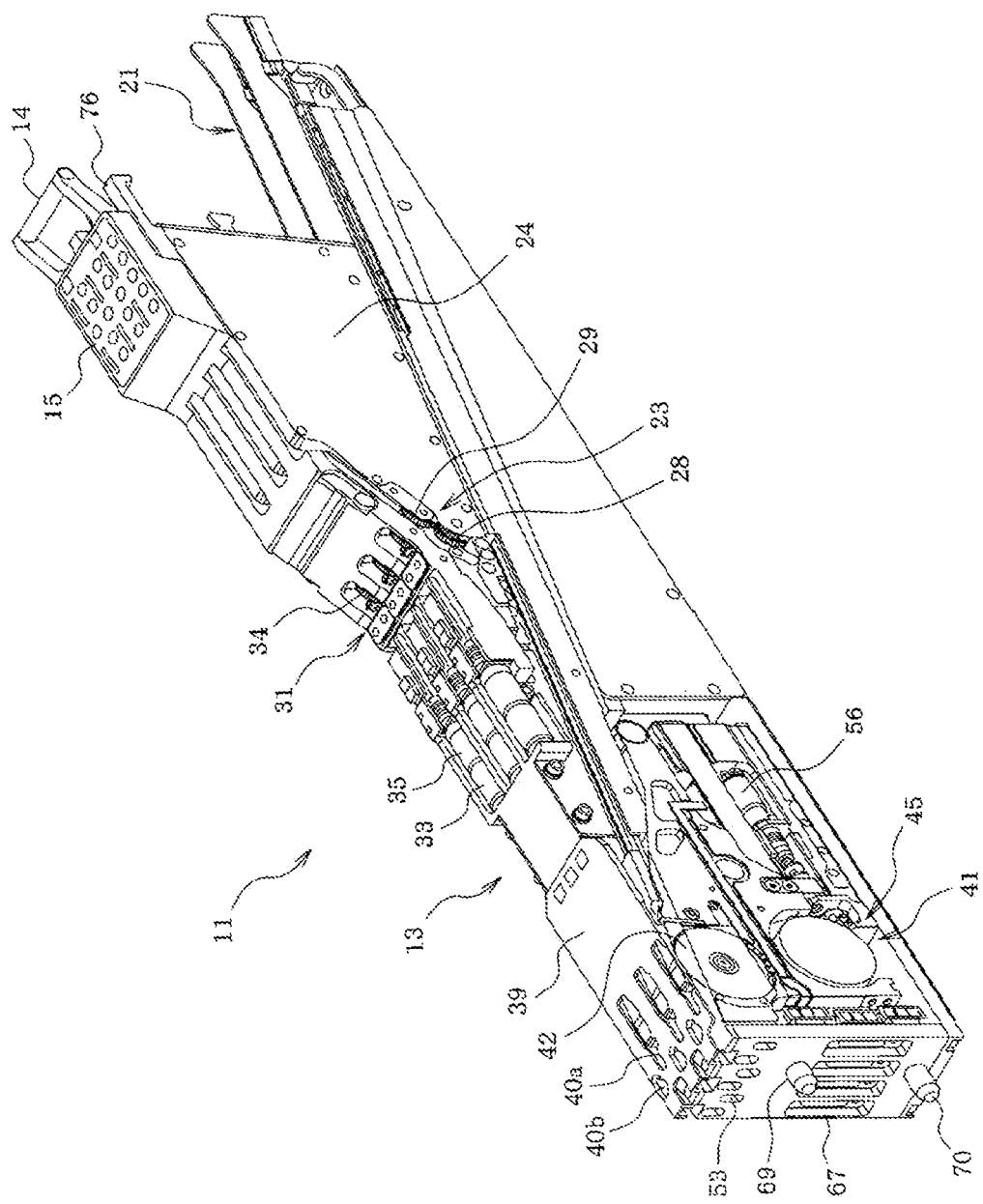
FIG. 3 is a (second) perspective view of the feeder main body.

The same number of sprocket driving units 41 as the number of component supply tapes 12 that can be set on feeder main body 13 are assembled lined up in the width direction on the leading end portion of feeder body 13, and sprocket 42 (see FIG. 3) is rotated by each sprocket driving unit 41 so as to pitch feed component supply tape 12.

Each sprocket driving unit 41 is configured to vertically move sprocket drive mechanism section 45 that drives sprocket 42 between an engaged position in which teeth of sprocket 42 engage with sprocket holes of component supply tape 12 and a retracted position in which the teeth of sprocket 42 are positioned lower than the sprocket holes of component supply tape 12; sprocket drive mechanism section 45 is biased upward by a spring (not shown) and sprocket 42 is held in the engaged position, and motor 56 is provided for lowering sprocket drive mechanism section 45 against the spring when attaching and detaching tape supplier 21 to and from tape feeder 11.

With this configuration, when attaching and detaching tape supplier 21 to and from tape feeder 11, if motor 56 for vertically moving the sprocket drive mechanism section is operated and sprocket drive mechanism section 45 is lowered to the retracted position against spring 55, the teeth of sprocket 42 are positioned lower than the sprocket holes of component supply tape 12, thus allowing operation for attaching and detaching tape supplier 21 to and from tape feeder 11; in addition, after tape supplier 21 has been set on tape feeder 11, if the motor 56 for vertically moving the sprocket drive mechanism section is rotated (or the drive force of motor 56 is released) to the original position, sprocket drive mechanism section 45 is raised to the engaged position by the spring and the teeth of sprocket 42 can be automatically engaged with the sprocket holes of component supply tape 12. By this, the work of attaching and removing tape suppliers 21 to and from tape feeder 11 is made easier.

Component pickup opening sections 40a and 40b that reveal the component pickup position such that up a component in component supply tape 12 can be picked up by a suction nozzle (not shown) are formed in a staggered manner in upper surface cover plate 39 that covers an upper side of sprocket driving unit 41 on feeder main body 13. In the present embodiment, a total of six component supply tapes 12 can be attached to feeder main body 13, so there are a total of six component pickup openings 40a and 40b.

Figure 7:
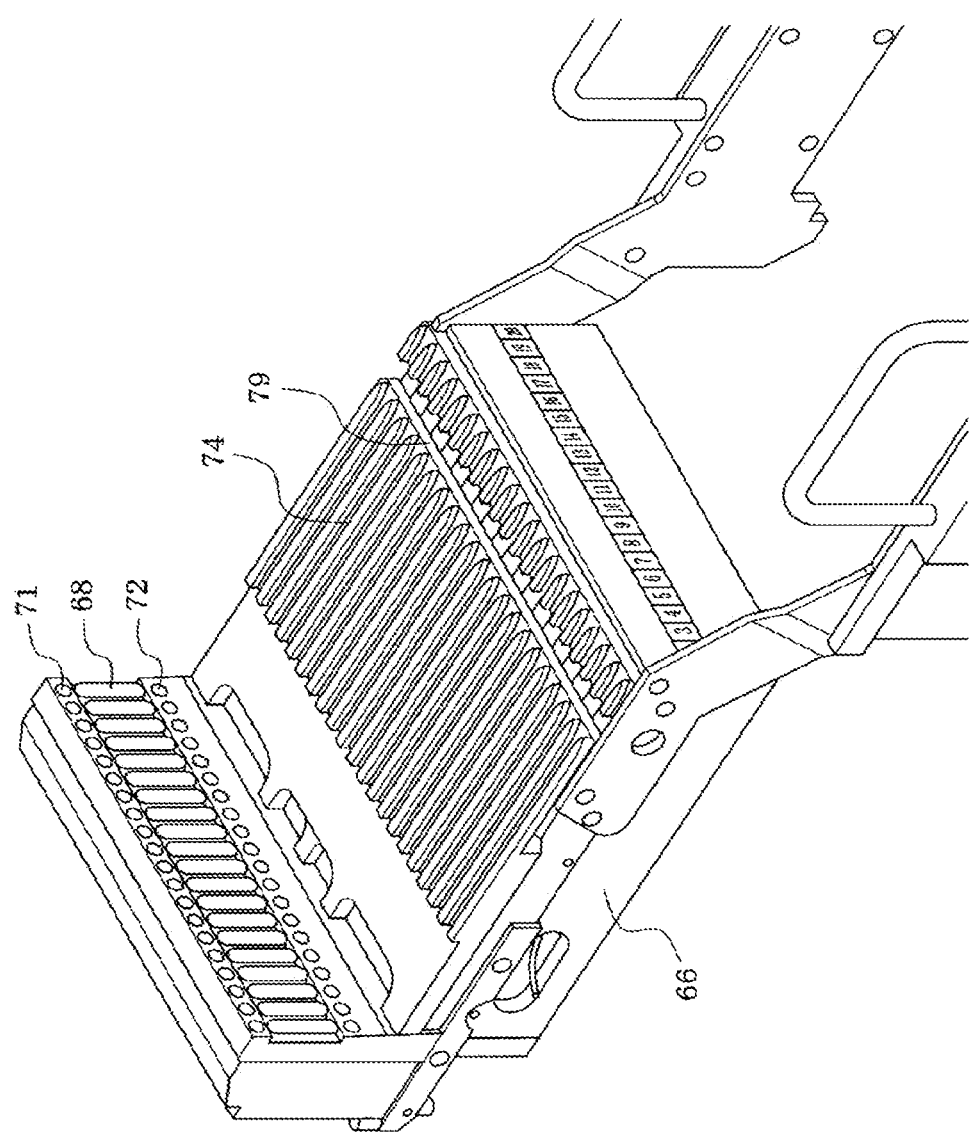
FIG. 7 is a perspective view of a feeder setting table of a component mounter.

Connector 67 for connecting a signal line and a power supply line of feeder main body 13 to a connector 68 (see FIG. 7) and two positioning pins 69 and 70 are provided in a leading end surface of feeder main body 13, and by inserting the two positioning pins 69 and 70 into position holes 71 and 72 (see FIG. 7) of feeder setting table 66 of a component mounter, the attachment position of feeder main body 13 on feeder setting table 66 is determined and connector 67 of feeder main body 13 is inserted into and connected to connector 68 of feeder setting table 66.

In order to support tape feeders 11 in an upright position, guide grooves 74 with an upside-down T-shaped cross section are provided on the upper surface of feeder setting table 66, and by inserting a guide rail (not shown) with an upside-down T-shaped cross section that is provided on the underside of feeder main body 13 into a guide groove 74 from the front, tape feeder 11 is supported on feeder setting table 66 in an upright position, and by clamping feeder main body 13 by pushing feeder main body 13 forward (to the side with connector 68 of feeder setting table 66) such that a clamp member (not shown) provided on feeder main body 13 is inserted into clamp groove 79 of feeder setting table 66, feeder main body 13 is positioned in the front-rear direction and attached on feeder setting table 66 in a removable manner.

Figure 8:
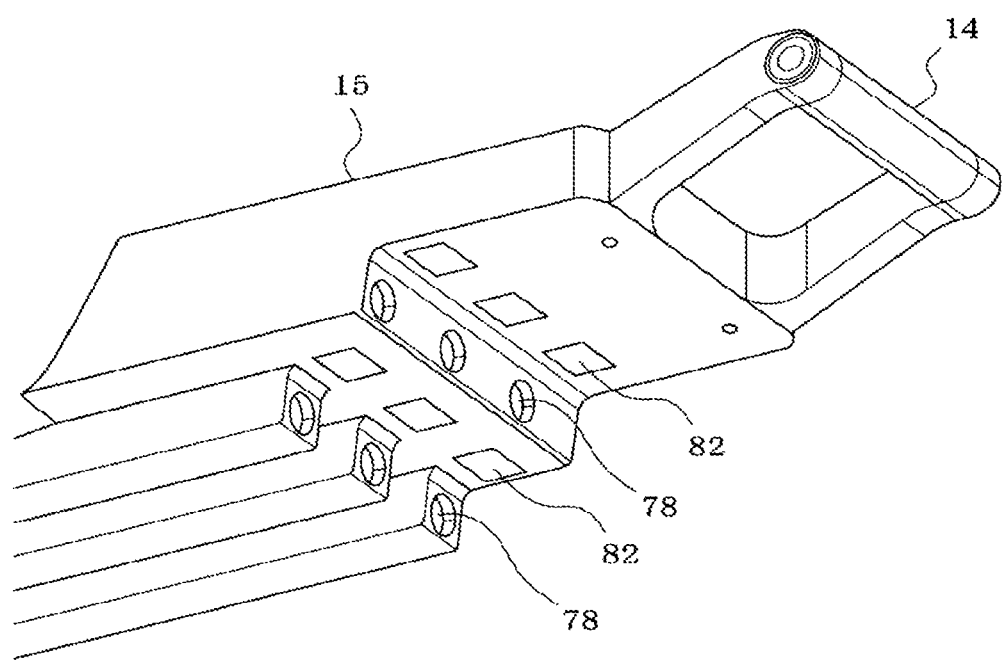
FIG. 8 is a perspective view showing the configuration of the underside of an operation panel of the feeder main body.

Handle 76 is provided on each upper rear end of cover tape collection case 24 of each tape supplier 21, and positioning pin 77 (see FIG. 9) is provided on the front end of each handle 76. Correspondingly, positioning hole 78 (see FIG. 8) is formed in a lower stepped portion of operation panel 15 of feeder main body 13, and when tape supplier 21 is set on feeder main body 13, positioning pin 77 of handle section 76 is inserted into positioning hole 78 on the lower side of operation panel 15, thereby positioning handle section 76 with respect to the lower surface of operation panel 15. In the present embodiment, it is possible to perform attachment work of tape suppliers 21 to feeder main body 13 with tape feeder 11 set on feeder setting table 66 of the component mounter.

Figure 9:
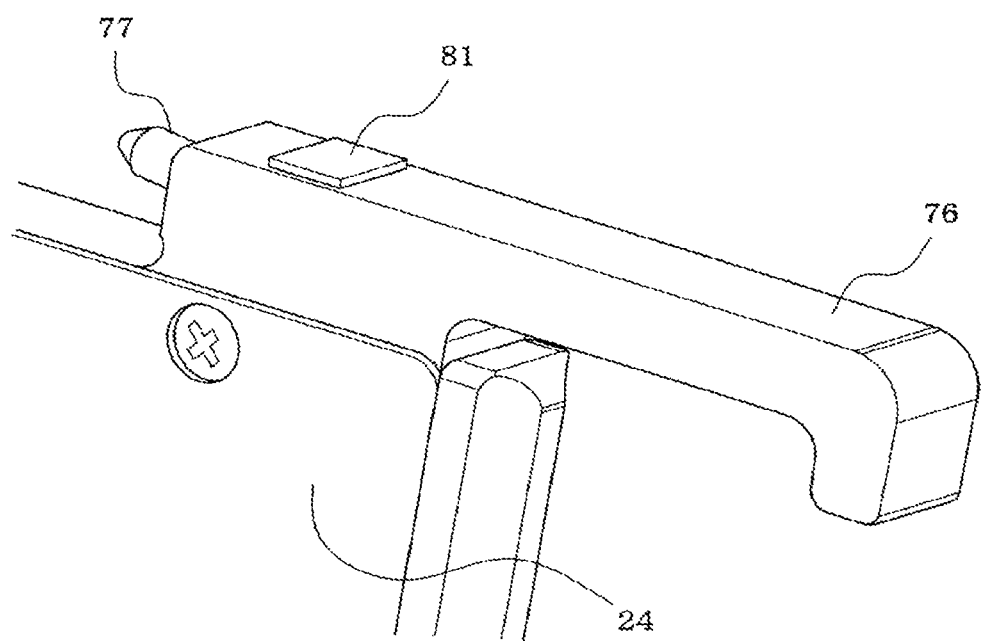
FIG. 9 is an enlarged perspective view of the tape supplier handle and a surrounding portion.

As shown in FIG. 9, RF tag 81 (also referred to as an electronic tag, IC tag, electromagnetic tag, or wireless tag) with tape supplier 21 identification information (hereafter also referred to as "supplier ID") memorized is attached to the upper surface of handle 76. Information such as component information of component supply tape 12 may also be memorized on RF tag 81 as well as the supplier ID, or instead of the supplier ID.

With respect to this, reader 82 (see FIG. 8) for reading the supplier ID memorized on RF tag 81 is provided on the underside of operation panel 15 of feeder main body 13, so that when tape supplier 21 is set on feeder main body 13 and positioning pin 77 of handle 76 is inserted into positioning hole 78 on the underside of operation panel 15, RF tag 81 on the upper surface of handle 76 comes adjacent and opposite to reader 82 on the underside of operation panel 15, and the supplier ID memorized on RF tag 81 is read by reader 82.

The supplier ID signal outputted by reader 82 is also used as the set confirmation signal of tape supplier 21 onto feeder main body 13, so that the setting of tape supplier 21 onto feeder main body 13 is confirmed by reading the supplier ID with reader 82. Note that, for reader 82 arranged on the underside of operation panel 15, at least the antenna of reader 82 should be arranged; but the control circuit section of reader 82 may be separated from the antenna and arranged on another section.

On the other hand, feeder main body 13 is provided with a control device (not shown) that controls operation of items such as each motor 33 and 56; the supplier ID read by reader 82 is sent to the control device, and then sent from the control device to a control device (not shown) of the component mounter via connectors 67 and 68. Feeder main body 13 identification information (hereafter also referred to as "feeder main body ID") is memorized in memory (not shown) of the control device of feeder main body 13, and this feeder main body ID is also sent from the control device of feeder main body 13 to the control device of the component mounter via connectors 67 and 68.

Further, each sprocket driving unit 41 is also provided with ID memorizing memory (not shown) that memorizes the identification information of sprocket driving unit 41 (hereafter also referred to as "sprocket moving unit ID"), and the control device of feeder main body 13 reads the sprocket moving unit ID memorized in the sprocket driving unit 41 ID memorizing memory and sends it to the control device of the component mounter. By this, the control device of the electronic component mounter can individually manage tape suppliers 21, feeder main bodies 13, and sprocket driving units 41 using the supplier ID, feeder main body ID, and sprocket driving unit ID.

However, with the tape feeder of the present embodiment, when tape supplier 21 is removed from feeder main body 13, because the connection between cover tape pulling gear 29 on the tape supplier 21 side and gear driving device 31 on the feeder main body 13 side is broken, and the self holding power of gear driving device 31 on the feeder main body 13 side no longer applies to cover tape pulling gear 29 on the tape supplier 21 side, it is necessary to prevent the reverse rotation (cover tape take-up) of the cover tape pulling gears 28 and 29 on the tape supplier 21 side.

Figure 11:
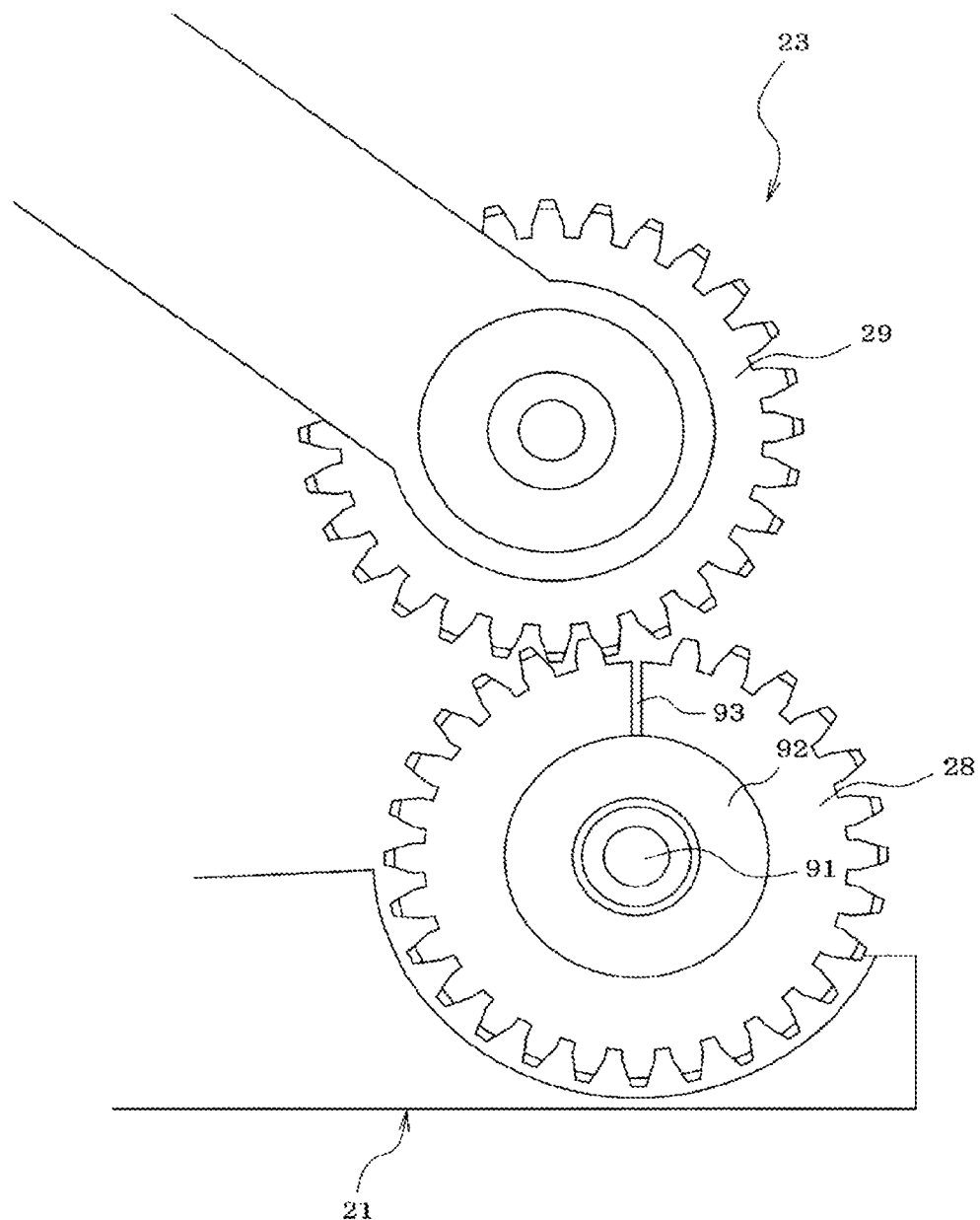
FIG. 11 is a side view showing a state with two gears of the cover tape pulling device engaged.

Thus, with the present embodiment, as shown in FIG. 11, one-directional clutch 92 that only allows rotation in the forwards direction that is the cover tape pulling direction is provided between, of the two cover tape pulling gears 28 and 29, the lower side cover tape pulling gear 28 and shaft 91 thereof, such that reverse rotation (cover tape take-up) of cover tape pulling gears 28 and 29 is prevented by one-directional clutch 92.

Further, for the engaging portion of one-directional clutch 92 and cover tape pulling gear 28, the friction of the engaging portion of one-directional clutch 92 and cover tape pulling gear 28 is adjusted such that cover tape pulling gear 28 slip rotates in the reverse direction when a specified rotational force or greater in the reverse direction that is greater than the force required to peel the cover tape is applied to cover tape pulling gear 28.

With such a configuration in which cover tape pulling gear 28 slip rotates in the reverse direction when a specified rotational force or greater in the reverse direction is applied to cover tape pulling gear 28 engaged with one-directional clutch 92, if the manufacturing variations of the internal diameter of cover tape pulling gear 28 and the external diameter of one-directional clutch 92 are large, the variation of the frictional force between the engaging portion of one-directional clutch 92 and cover tape pulling gear 28 are large, meaning that the variation in the rotational force in the reverse direction required to reverse rotate cover tape pulling gear 28 is undesirably large.

To counter this, in the present embodiment, a single expansion groove 93 is formed at a specified location in cover tape pulling gear 28 with one-directional clutch 92, such that the internal diameter of cover tape pulling gear 28 is elastically deformable. By forming expansion groove 93 on cover tape pulling gear 28, it is possible to elastically deform the internal diameter of cover tape pulling gear 28 in accordance with the variation in the external diameter of one-directional clutch 92, making it possible to absorb the manufacturing variation in the internal diameter of cover tape pulling gear 28 and the external diameter of one-directional clutch 92 via the change in the dimension of the gap in expansion groove 93, thus decreasing the variation in the reverse rotational force required to reverse rotate cover tape pulling gear 28. By this, it is possible to allow less strict management of the dimensional accuracies of one-directional clutch 92 and cover tape pulling gear 28, and even in a case in which the dimensional variation is large, it is possible to keep the variation in the reverse rotational force required to reverse rotate cover tape pulling gear 28 within an allowable range, thereby maintaining stable product quality and low costs.

However, depending on the position at which expansion groove 93 is formed cover tape pulling gear 28, teeth of the opposite cover tape pulling gear 29 might more easily interfere with expansion groove 93, possible inhibiting the smooth rotation of cover tape pulling gears 28 and 29.

Thus, with the present embodiment, a tooth of cover tape pulling gear 28 with one-directional clutch 92 is missing, and expansion groove 93 is formed in a center section of the portion at which the tooth is missing. Accordingly, the gap between expansion groove 93 and the tooth of the opposite cover tape pulling gear 29 is widened, preventing interference between expansion groove 93 and the tooth of the opposite cover tape pulling gear 29, thereby preventing the inhibiting of the smooth rotation of cover tape pulling gears 28 and 29 that might otherwise occur due to expansion groove 93.

In this case, for the two teeth adjacent to expansion groove 93 among the teeth of cover tape pulling gear 28 with one-directional clutch 92, the tooth pitch changes based on the change in the dimension of the gap of expansion groove 93, which may lead to the occurrence of cover tape pulling gear 28 and 29 engaging problems.

Figure 12:
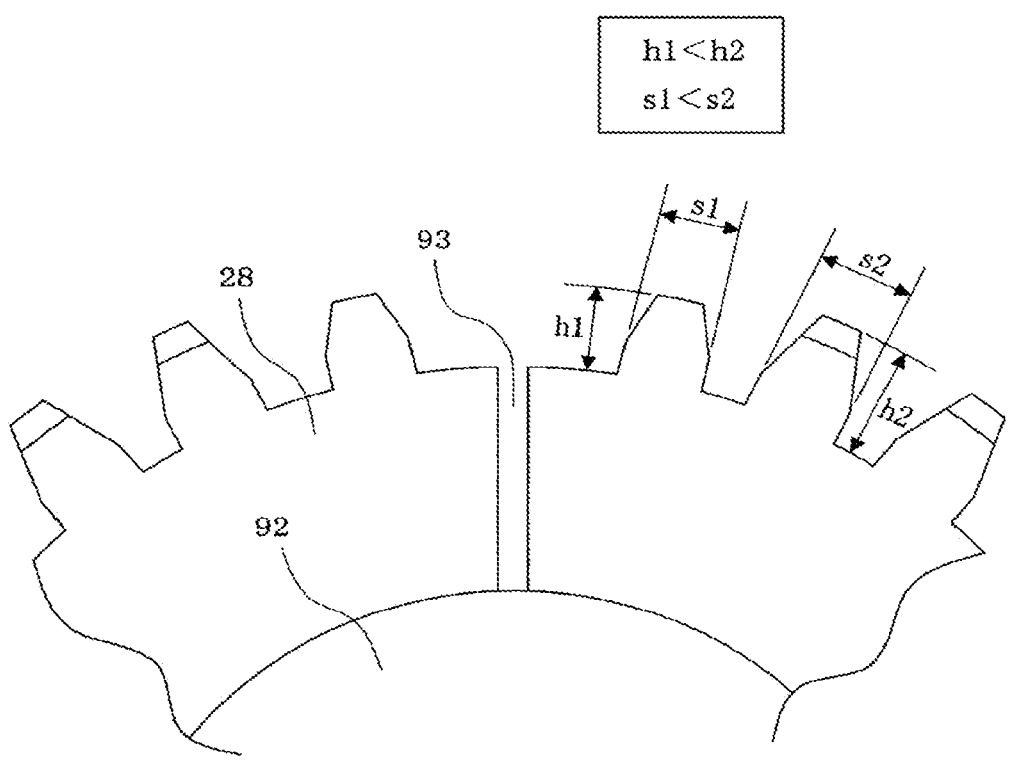
FIG. 12 is an enlarged side view showing the shape of the teeth on both sides of the expansion groove on the gear with a one-directional clutch.

For this, with the present embodiment, as shown in FIG. 12, the two teeth adjacent to expansion groove 93 of cover tape pulling gear 28 with one-directional clutch 92 are formed with a tooth depth h1 that is lower than the tooth depth h2 of the other teeth, and a tooth thickness s1 that is smaller than the tooth thickness s2 of the other teeth. Accordingly, it is possible to prevent the occurrence of gear engaging problems between the two teeth adjacent to expansion groove 93 on cover tape pulling gear 28 with one-directional clutch 92 and teeth of the opposite cover tape pulling gear 29.

According to the present embodiment as described above, because the configuration is such that cover tape pulling gear 28 slip rotates in the reverse direction when a specified rotational force or greater in the reverse direction that is greater than a force required to peel the cover tape is applied with respect to cover tape pulling gear 28 that sandwiches the cover tape, the configuration that allows rotation of cover tape pulling gear 28 in the reverse direction (take-up of the cover tape) is simple, and a demand for lower costs is satisfied. Further, because there is no need to provide a release mechanism that switches between operation and non-operation of the reverse rotation prevention function of one-directional clutch 92, an operator does not have to perform operation of switching between operation and non-operation of the reverse rotation prevention function of one-directional clutch 92, and, as well as it being possible to take up the cover tape by reverse rotating the gears with a simple operation of just pulling the cover tape in the take-up direction, it is possible to reliably operate the reverse rotation prevention function of one-directional clutch 92 during feeding operation of component supply tape 12, cover tape is reliably peeled from the top surface of component supply tape 12, and occurrences of component pickup errors are prevented.

Note that, in the present embodiment, one-directional clutch 92 is provided on cover tape pulling gear 28, which is the lower of the two cover tape pulling gears 28 and 29, but a one-directional clutch may be provided on cover tape pulling gear 29, which is the upper of the two gears, or a one-directional clutch may be provided on both of the cover tape pulling gears 28 and 29.

In addition, the present disclosure is not limited to a tape feeder configured such that tape supplier 21 that guides component supply tape 12 pulled from tape reel 16 to a component pickup position is removably set on feeder main body 13, and various changes may be applied without departing from the scope, such as applying to a tape feeder with a standard configuration that does not use tape supplier 21.

REFERENCE SIGNS LIST

11: tape feeder; 12: component supply tape; 13: feeder main body; 15: operation panel; 16: tape reel; 17: reel holder; 21: tape supplier; 22: reel hook; 23: cover tape peeling device; 24: cover tape collection case; 25: peeling roller; 28, 29: cover tape pulling gear; 31: gear driving device; 33: motor; 34: drive gear; 35: reduction mechanism; 41: sprocket driving unit (tape feeding device); 42: sprocket; 45: sprocket drive mechanism section; 56: motor for vertically moving the sprocket drive mechanism section; 66: feeder setting table; 67, 68: connector; 69, 70: positioning pin; 71, 72: positioning hole; 74: guide groove; 77: positioning pin; 78: positioning hole; 91: shaft; 92: one-directional clutch; 93: expansion groove

The invention claimed is:

1. A tape feeder comprising:
a tape feeding device configured to feed component supply tape to a component pickup position; and
a cover tape pulling device configured to peel cover tape from a top surface of the component supply tape forward of the component pickup position and pull the cover tape in a direction opposite to the tape feeding direction in accordance with the feeding operation of the component supply tape;
wherein
the cover tape pulling device is configured to pull the cover tape by sandwiching the cover tape peeled from the top surface of the component supply tape between two gears that engage with each other, the cover tape being pulled by the gears being rotated by a gear driving device,
a one-directional clutch that allows only rotation in a forward direction that is a winding direction of the cover tape is provided between, from among the two gears, at least one of the gears and a shaft thereof,
an engaging portion of the one-directional clutch and the gear is configured such that the gear slip rotates in a reverse direction when a specified rotational force or greater in the reverse direction that is greater than a force required to peel the cover tape is applied with respect to the gear, and
an expansion groove is formed in the gear that engages with the one-directional clutch, such that an internal diameter of the gear is elastically deformable.

2. The tape feeder according to claim 1, wherein
one of the teeth of the gear engaged with the one-directional clutch is missing, and the expansion groove is formed at a center section of the portion at which the tooth is missing.

3. The tape feeder according to claim 2, wherein
two teeth adjacent to the expansion groove from among the teeth of the gear engaged with the one-directional clutch are formed with a lower tooth depth and a smaller tooth thickness compared to the other teeth.

4. The tape feeder according to claim 1, wherein
a tape supplier that guides the component supply tape pulled from a tape reel to the component pickup position is removably set on a feeder main body,
the two gears are provided on the tape supplier, and
the gear driving device is provided on the feeder main body.

* * * * *